United States Patent
Hsieh et al.

(10) Patent No.: US 6,420,233 B1
(45) Date of Patent: Jul. 16, 2002

(54) SPLIT GATE FIELD EFFECT TRANSISTOR (FET) DEVICE EMPLOYING NON-LINEAR POLYSILICON FLOATING GATE ELECTRODE DOPANT PROFILE

(75) Inventors: Chia-Ta Hsieh, Tanan; Di-Son Kuo, Hsinchu; Jake Yeh; Chung-Li Chang, both of Hsin-Chu; Wen-Ting Chu, Kaohsiung County; Chrong-Jung Lin, Taipei, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/766,860

(22) Filed: Jan. 19, 2001

(51) Int. Cl.$^7$ ...................... H01L 29/336; H01L 29/788
(52) U.S. Cl. ........................ 438/257; 438/263; 257/315
(58) Field of Search ................................. 257/315, 316, 257/317, 318, 319, 320, 321; 438/201, 211, 257, 266, 260, 262, 263, 264, 594

(56) References Cited

U.S. PATENT DOCUMENTS

| | | | |
|---|---|---|---|
| 5,614,747 A | * 3/1997 | Ahn et al. | .................. 257/316 |
| 5,940,706 A | * 8/1999 | Sung et al. | .................. 438/261 |
| 6,005,809 A | 12/1999 | Sung et al. | |
| 6,043,530 A | 3/2000 | Chang | |
| 6,058,043 A | 5/2000 | Houdt et al. | |
| 6,180,977 B1 | * 1/2001 | Lin et al. | ..................... 257/261 |
| 6,180,980 B1 | * 1/2001 | Wang | ......................... 257/322 |
| 6,200,859 B1 | * 3/2001 | Huang et al. | ............... 438/264 |

* cited by examiner

Primary Examiner—Sara Crane
Assistant Examiner—Samuel Admassu Gebremariam
(74) Attorney, Agent, or Firm—Tung & Associates

(57) ABSTRACT

Within both a split gate field effect transistor (FET) device and a method for fabricating the split gate field effect transistor (FET) device there is employed a doped polysilicon floating gate electrode having an central annular portion having a higher dopant concentration than a peripheral annular portion of the doped polysilicon floating gate electrode. The higher dopant concentration within the central annular portion of the doped polysilicon floating gate electrode provides enhanced programming speed properties of the split gate field effect transistor (FET) device. The lower dopant concentration within the peripheral annular portion of the doped polysilicon floating gate electrode provides enhanced erasing speed properties within the split gate field effect transistor (FET) device under certain circumstances of fabrication of the split gate field effect transistor (FET) device.

8 Claims, 2 Drawing Sheets

SPLIT GATE FIELD EFFECT TRANSISTOR (FET) DEVICE EMPLOYING NON-LINEAR POLYSILICON FLOATING GATE ELECTRODE DOPANT PROFILE

BACKGROUND OF THE INVENTION

1. Field of the Invention

The present invention relates generally to split gate field effect transistor (FET) devices, as employed within semiconductor integrated circuit microelectronic fabrications.

More particularly, the present invention relates to split gate field effect transistor (FET) devices with enhanced properties, as employed within semiconductor integrated circuit microelectronic fabrications.

2. Description of the Related Art

In addition to conventional semiconductor integrated circuit microelectronic fabrications having formed therein conventional field effect transistor (FET) devices and conventional bipolar junction transistor (BJT) devices whose transient operation provides for data storage and transduction capabilities within the conventional semiconductor integrated circuit microelectronic fabrications, there also exists within the art of semiconductor integrated circuit microelectronic fabrication non-volatile semiconductor integrated circuit microelectronic fabrications, and in particular non-volatile semiconductor integrated circuit microelectronic memory fabrications, such as but not limited to electrically erasable programable read only memory (EEPROM) non-volatile semiconductor integrated circuit microelectronic memory fabrications, whose data storage and transduction capabilities are not predicated upon transient operation.

Although non-volatile semiconductor integrated circuit microelectronic memory fabrications, such as but not limited to electrical erasable programmable read only memory (EEPROM) non-volatile semiconductor integrated circuit microelectronic memory fabrications, may be fabricated while employing any of several semiconductor integrated circuit microelectronic devices, a particularly common semiconductor integrated circuit microelectronic device employed within an electrically erasable programmable read only memory (EEPROM) non-volatile semiconductor integrated circuit microelectronic memory fabrication is a split gate field effect transistor (FET) device.

A split gate field effect transistor (FET) device is in part analogous in structure and operation with a conventional field effect transistor (FET) device insofar as a split gate field effect transistor (FET) device also comprises formed within a semiconductor substrate a channel region defined by a pair of source/drain regions also formed within the semiconductor substrate, wherein at least the channel region of the semiconductor substrate has formed thereupon a gate dielectric layer which separates a gate electrode from the channel region of the semiconductor substrate, but a split gate field effect transistor (FET) device is nonetheless distinguished from a conventional field effect transistor (FET) device by employing rather than a single gate electrode positioned upon the gate dielectric layer and completely covering the channel region of the semiconductor substrate: (1) a floating gate electrode positioned upon the gate dielectric layer and covering over only a portion of the channel region defined by the pair of source/drain regions (such portion of the channel region also referred to as a floating gate electrode channel region); and (2) a control gate electrode positioned over the gate dielectric layer and covering a remainder portion of the channel region while at least partially covering and overlapping the floating gate electrode while being separated from the floating gate electrode by an inter-gate electrode dielectric layer (such remainder portion of the channel region also referred to as a control gate electrode channel region).

In order to effect operation of a split gate field effect transistor (FET) device, particular sets of voltages are applied to the control gate electrode, the source/drain regions and the semiconductor substrate in order to induce charge, reduce charge or sense charge within the floating gate electrode (which is otherwise fully electrically isolated) and thus provide conditions under which the floating gate electrode within the split gate field effect transistor (FET) device may be programmed, erased and/or read.

While split gate field effect transistor (FET) devices are thus desirable within the art of semiconductor integrated circuit microelectronic fabrication for providing semiconductor integrated circuit microelectronic fabrications with non-volatile data storage characteristics, split gate field effect transistor (FET) devices are nonetheless not entirely without problems in the art of semiconductor integrated circuit microelectronic fabrication.

In that regard, it is often difficult to form within non-volatile semiconductor integrated circuit microelectronic fabrications split gate field effect transistor (FET) devices with enhanced properties, such as but not limited to enhanced programming speed properties and enhanced erasing speed properties.

It is thus towards the goal of providing for use within semiconductor integrated circuit microelectronic fabrications, and in particular within semiconductor integrated circuit microelectronic memory fabrications, split gate field effect transistor (FET) devices with enhanced properties, such as but not limited to enhanced programming speed properties and enhanced erasing speed properties, that the present invention is directed.

Various non-volatile semiconductor integrated circuit microelectronic fabrications, associated semiconductor integrated circuit microelectronic devices formed therein, methods for fabrication thereof and methods for operation thereof, have been disclosed within the art of non-volatile semiconductor integrated circuit microelectronic fabrication.

For example, Sung et al., in U.S. Pat. No. 6,005,809, discloses a method for programming within a semiconductor integrated circuit microelectronic fabrication a split gate field effect transistor (FET) device with enhanced programming speed properties and a method for erasing within the semiconductor integrated circuit microelectronic fabrication the split gate field effect transistor (FET) device with enhanced erasing speed properties, while simultaneously enhancing a cycling endurance property of the split gate field effect transistor (FET) device. To realize the enhanced programming speed properties, the programming method employs applying within the split gate field effect transistor (FET) device a simultaneous first positive voltage to a control gate electrode, a first moderately negative voltage to a semiconductor substrate and a first slightly positive voltage to a drain region in order to establish a constant programming current, and then applying a second positive voltage to a source region for programming purposes. Similarly, to realize the enhanced erasing speed, the erasing method employs applying within the split gate field effect transistor (FET) device a large positive voltage to the control gate electrode, the first moderately negative voltage to the semiconductor substrate and a second moderately negative voltage to the source region.

In addition, Chang, in U.S. Pat. No. 6,043,530, discloses an electrically erasable programmable read only memory (EEPROM) device that may be both programmed and read while employing low currents for both programming operations and erasing operations. The electrically erasable programmable read only memory (EEPROM) device is fabricated with a structure generally analogous with a stacked gate field effect transistor (FET) device, but with a control gate of width less than a floating gate width and centered within the floating gate width, and further wherein there is employed adjacent both the floating gate and the control gate, but spaced further from the control gate than the floating gate, a polysilicon sidewall spacer employed as an erasing gate electrode.

Finally, Houdt et al., in U.S. Pat. No. 6,058,043, discloses a non-volatile semiconductor integrated circuit microelectronic memory fabrication device, and a method for fabricating the non-volatile semiconductor integrated circuit microelectronic memory fabrication device, wherein the non-volatile semiconductor integrated circuit microelectronic memory fabrication device exhibits both enhanced programming properties and enhanced erasing properties while employing particularly low operating voltages and particularly low operating powers and while further avoiding stress induced leakage current (SILC) losses within the non-volatile semiconductor integrated circuit microelectronic memory fabrication device. To realize the foregoing objects, the non-volatile semiconductor integrated circuit microelectronic memory fabrication device is fabricated with a structure generally analogous with a split gate field effect transistor (FET) device structure, but wherein there is provided an additional programming gate electrode: (1) vertically spaced from and capacitively coupled to a floating gate electrode within the non-volatile semiconductor integrated circuit microelectronic memory fabrication device; and (2) laterally spaced from a control gate electrode within the non-volatile semiconductor integrated circuit microelectronic memory fabrication device.

Desirable within the art of non-volatile semiconductor integrated circuit microelectronic fabrication, and in particular within the art of non-volatile semiconductor integrated circuit microelectronic memory fabrication, are additional methods and materials which may be employed for forming split gate field effect transistor (FET) devices with enhanced properties, such as but not limited to enhanced programming speed properties and enhanced erasing speed properties.

It is towards the foregoing objects that the present invention is directed.

SUMMARY OF THE INVENTION

A first object of the present invention is to provide for use within a semiconductor integrated circuit microelectronic fabrication a split gate field effect transistor (FET) device, and a method for fabricating the split gate field effect transistor (FET) device.

A second object of the present invention is to provide the split gate field effect transistor (FET) device and the method for fabricating the split gate field effect transistor (FET) device in accord with the first object of the present invention, wherein the split gate field effect transistor (FET) device is fabricated with enhanced properties.

A third object of the present invention is to provide the split gate field effect transistor (FET) device and the method for fabricating the split gate field effect transistor (FET) device in accord with the first object of the present invention and the second object of the present invention, wherein the method is readily commercially implemented.

In accord with the objects of the present invention, there is provided by the present invention a split gate field effect transistor (FET) device and a method for fabricating the split gate field effect transistor (FET) device. To practice the method of the present invention, there is first provided a semiconductor substrate. There is then formed upon the semiconductor substrate a gate dielectric layer. There is then formed upon the gate dielectric layer a doped polysilicon floating gate electrode, where the doped polysilicon floating gate electrode has a higher dopant concentration in a central annular portion of the doped polysilicon floating gate electrode than in a peripheral annular portion of the doped polysilicon floating gate electrode. There is then formed over the doped polysilicon floating gate electrode an inter-gate electrode dielectric layer. There is then formed over the inter-gate electrode dielectric layer and covering at least a portion of the doped polysilicon floating gate electrode a control gate electrode. Finally, there is also formed into the semiconductor substrate a pair of source/drain regions which define within the semiconductor substrate a floating gate electrode channel with respect to the doped polysilicon floating gate electrode and an adjoining control gate electrode channel with respect to the control gate electrode.

The method of the present invention contemplates a split gate field effect transistor (FET) device which may be fabricated employing the method of the present invention.

The present invention provides: (1) a method for fabricating within a semiconductor integrated circuit microelectronic fabrication, and in particular within a non-volatile semiconductor integrated circuit microelectronic memory fabrication, a split gate field effect transistor (FET) device; and (2) the split gate field effect transistor (FET) device fabricated employing the method, where the split gate field effect transistor (FET) device is fabricated with enhanced properties, such as but not limited to enhanced programming speed properties and enhanced erasing speed properties. The present invention realizes the foregoing objects by employing when fabricating a split gate field effect transistor (FET) device a doped polysilicon floating gate electrode, where the doped polysilicon floating gate electrode has a higher dopant concentration in a central annular portion of the doped polysilicon floating gate electrode than in a peripheral annular portion of the doped polysilicon floating gate electrode. By employing the higher dopant concentration in the central annular portion of the doped polysilicon floating gate electrode there may be realized within the split gate field effect transistor (FET) device enhanced coupling, in particular to a source/drain region formed within a semiconductor substrate beneath the doped polysilicon floating gate electrode, and thus enhanced programming speed properties within the split gate field effect transistor (FET) device. By employing the lower dopant concentration within the peripheral annular portion of the doped polysilicon floating gate electrode, there is provided enhanced dimensional control when forming within the split gate field effect transistor (FET) device an inter-gate electrode dielectric layer while employing a thermal oxidation method which consumes part of the doped polysilicon floating gate electrode, and thus there is similarly also provided enhanced erasing speed properties within the split gate field effect transistor (FET) device.

The split gate field effect transistor (FET) device fabricated in accord with the present invention is readily commercially implemented. A split gate field effect transistor (FET) device fabricated in accord with the present invention employs methods and materials as are generally known in the art of emiconductor integrated circuit microelectronic fabrication, including but not limited to non-volatile semiconductor integrated circuit microelectronic memory fabrication, but employed within the context of a novel ordering and sequencing of process steps and materials fabrication to provide the split gate field effect transistor (FET) device in accord with the present invention. Since it is thus a novel ordering and sequencing of process steps and materials fabrication that provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides: (1) a method for fabricating within a semiconductor integrated circuit microelectronic fabrication, and in particular within a non-volatile semiconductor integrated circuit microelectronic memory fabrication, a split gate field effect transistor (FET) device; and (2) the split gate field effect transistor (FET) fabricated employing the method, where the split gate field effect transistor (FET) device is fabricated with enhanced properties, such as but not limited to enhanced programming speed properties and enhanced erasing speed properties. The present invention realizes the foregoing objects by employing when fabricating a split gate field effect transistor (FET) device a doped polysilicon floating gate electrode, where the doped polysilicon floating gate electrode has a higher dopant concentration in a central annular portion of the doped polysilicon floating gate electrode than in a peripheral annular portion of the doped polysilicon floating gate electrode. By employing the higher dopant concentration in the central annular portion of the doped polysilicon floating gate electrode there may be realized within the split gate field effect transistor (FET) device enhanced coupling, in particular to a source/drain region formed within a semiconductor substrate beneath the doped polysilicon floating gate electrode, and thus enhanced programming speed properties within the split gate field effect transistor (FET) device. By employing the lower dopant concentration within the peripheral annular portion of the doped polysilicon floating gate electrode, there is provided enhanced dimensional control when forming within the split gate field effect transistor (FET) device an inter-gate electrode dielectric layer while employing a thermal oxidation method that consumes part of the doped polysilicon floating gate electrode, and thus there is similarly also provided enhanced erasing speed properties within the split gate field effect transistor (FET) device.

The split gate field effect transistor (FET) device fabricated in accord with the present invention may be fabricated within a non-volatile semiconductor integrated circuit microelectronic fabrication such as but not limited to a non-volatile semiconductor integrated circuit microelectronic memory fabrication such as but not limited to an electrically erasable programmable read only memory (EEPROM) non-volatile semiconductor integrated circuit microelectronic memory fabrication such as but not limited to a flash memory fabrication.

Referring now to FIG. 1 to FIG. 5, there is shown a series of schematic cross-sectional diagrams illustrating the results of progressive stages in forming within a semiconductor integrated circuit microelectronic fabrication, in accord with a preferred embodiment of the present invention, a split gate field effect transistor (FET) device.

Figure 1:
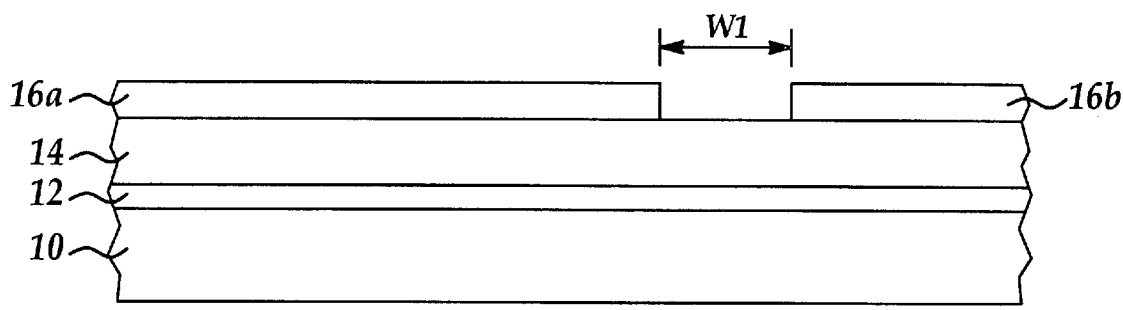
FIG. 1, FIG. 2, FIG. 3, FIG. 4, FIG. 5 and FIG. 6 show a series of schematic cross-sectional diagrams illustrating the results of progressive stages in fabricating within a semiconductor integrated circuit microelectronic fabrication in accord with a preferred embodiment of the present invention a split gate field effect transistor (FET) device.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed thereupon a blanket gate dielectric layer 12, in turn having formed thereupon a blanket polysilicon layer 14, in turn having formed thereupon a pair of patterned silicon nitride hard mask layers 16a and 16b.

Within the preferred embodiment of the present invention with respect to the semiconductor substrate 10, although it is known in the art of semiconductor integrated circuit microelectronic fabrication that semiconductor substrates may be formed with either dopant polarity, several dopant concentrations and various crystallographic orientations, for the preferred embodiment of the present invention, the semiconductor substrate 10 is typically and preferably a (100) silicon semiconductor substrate having an N- or P-doping of sufficient concentration to impart of from about 8 to about 12 ohm-cm to the semiconductor substrate 10.

Similarly, within the preferred embodiment of the present invention with respect to the blanket gate dielectric layer 12, although it is also known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention, the blanket gate dielectric layer 12 is typically and preferably formed employing a gate dielectric layer thermal growth method at a temperature of form about 800 to about 1100 degrees centigrade to form the blanket gate dielectric layer 12 of silicon oxide of thickness from about 70 to about 120 angstroms formed upon the semiconductor substrate 10.

Similarly, within the preferred embodiment of the present invention with respect to the blanket polysilicon layer 14, although it is known in the art of semiconductor integrated circuit microelectronic fabrication, including in particular semiconductor integrated circuit microelectronic memory fabrication, that blanket polysilicon layers may be formed employing methods including but not limited to chemical vapor deposition (CVD) methods, plasma enhanced chemical vapor deposition (PECVD) methods and physical vapor deposition (PVD) sputtering methods, for the preferred embodiment of the present invention the blanket polysilicon layer 14 is typically and preferably formed employing a chemical vapor deposition (CVD) method to form the blanket polysilicon layer 14 of either a doped polysilicon material or an undoped polysilicon material. Within the preferred embodiment of the present invention, the blanket polysilicon layer 14 is typically and preferably formed to a thickness of from about 500 to about 1500 angstroms.

Finally, within the preferred embodiment of the present invention with respect to the pair of patterned silicon nitride hard mask layers 16a and 16b, although it is known in the art of semiconductor integrated circuit microelectronic fabrication that silicon nitride hard mask layers may be formed from silicon nitride hard mask materials deposited employing methods including but not limited to chemical vapor deposition (CVD) methods, plasma enhanced chemical vapor deposition (PECVD) methods and physical vapor deposition (PVD) sputtering methods, in conjunction with appropriate photolithographic methods, for the preferred embodiment of the present invention, the pair of patterned silicon nitride hard mask layers 16a and 16b is typically and preferably formed employing a chemical vapor deposition (CVD) method to form the pair of patterned silicon nitride hard mask layers 16a and 16b, each of thickness from about 800 to about 2500 angstroms. As is similarly also illustrated within the schematic cross-sectional diagram of FIG. 1, the pair of patterned silicon nitride hard mask layers 16a and 16b defines an aperture of bidirectional (i.e., areal) aperture width W1 from about 0.15 to about 0.5 microns, having exposed at its bottom a portion of the blanket polysilicon layer 14.

Figure 2:
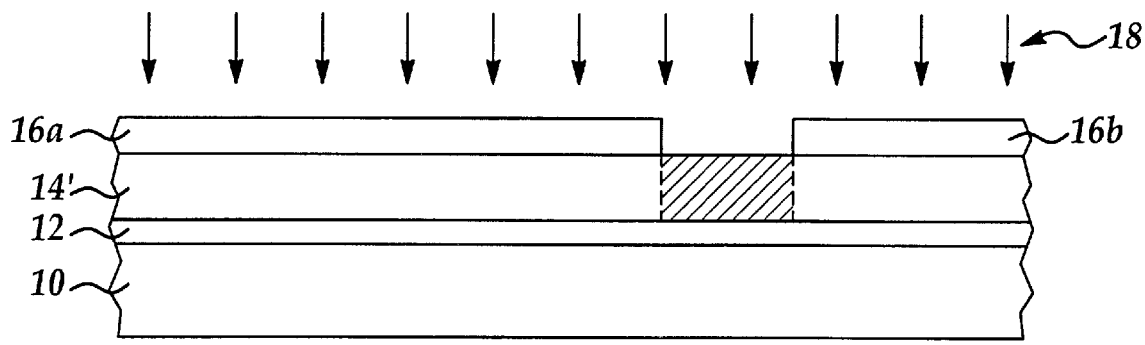

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is ion implanted, while employing a dose of implanting dopant ions 18, the portion of the blanket polysilicon layer 14 exposed within the bottom of the aperture defined by the pair of patterned silicon nitride hard mask layers 16a and 16b as illustrated within the schematic cross-sectional diagram of FIG. 1 to thus form from the blanket polysilicon layer 14 a partially ion implanted blanket polysilicon layer 14' having a heavily doped ion implanted region of bidirectional (i.e., areal) linewidth nominally corresponding with the bidirectional (i.e., areal) aperture width W1 defined by the pair of patterned silicon nitride hard mask layers 16a and 16b as illustrated within the schematic cross-sectional diagram of FIG. 1. Remaining portions of the partially ion implanted blanket polysilicon layer 14' are either undoped or comparatively lightly doped, as noted above.

Within the preferred embodiment of the present invention, the dose of implanting dopant ions 18 may, under circumstances where the blanket polysilicon layer 14 is formed originally as a uniformly and comparatively lightly doped blanket polysilicon layer be selected from any of several dopants as are conventional in the art of microelectronic fabrication and will typically and preferably employ as a major dopant constituent a dopant of polarity equivalent to the polarity of the blanket polysilicon layer 14 when comparatively lightly doped. Typically and preferably, although not necessarily exclusively, under such circumstances, a major dopant within the dose of implanting dopant ions 18 has a thermal diffusivity less than a dopant within the blanket polysilicon layer 14 when comparatively lightly doped.

As an alternative, and in particular under circumstances where the blanket polysilicon layer 14 is formed originally of an undoped polysilicon material, the dose of implanting dopant ions 18 will typically and preferably include two separate implanting dopant ions of equivalent polarity, but of widely differing thermal diffusivities. For example and without limitation, phosphorus implanting dopant ions and arsenic implanting dopant ions (or indium implanting dopant ions) may be simultaneously or sequentially employed under such circumstances when providing the dose of implanting dopant ions 18.

Typically and preferably, the dose of implanting ions 18 is provided into the exposed portion of the blanket polysilicon layer 14 as illustrated within the schematic cross-sectional diagram of FIG. 1 to provide the partially ion implanted blanket polysilicon layer 14' as illustrated within the schematic cross-sectional diagram of FIG. 2 while employing an aggregate ion implantation dose of from about 1E14 to about 1E15 dopant ions per square centimeter and an ion implantation energy of from about 10 to about 40 keV, with generally a higher sub-dose of a dopant having comparatively lower thermal diffusivity in comparison with a sub-dose of a dopant having a comparatively higher thermal diffusivity.

Figure 3:
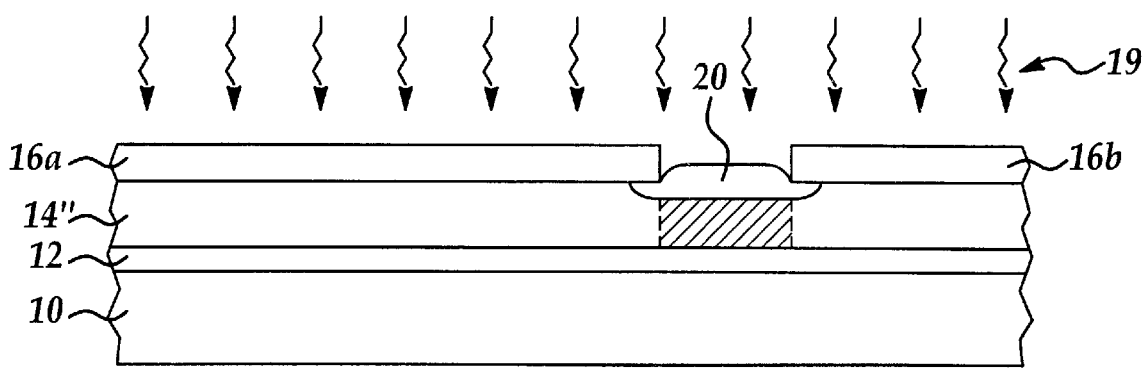

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the semiconductor integrated circuit microelectronic fabrication has been thermally annealed within a first oxidizing thermal annealing atmosphere 19 to form from a portion of the partially ion implanted blanket polysilicon layer 14' as exposed within the aperture defined by the pair of patterned silicon nitride hard mask layers 16a and 16b as illustrated within the schematic cross-sectional diagram of FIG. 2 a patterned silicon oxide hard mask layer 20. As is illustrated within the schematic cross-sectional diagram of FIG. 3, the patterned silicon oxide hard mask layer 20 extends in part underneath each of the pair of patterned silicon nitride hard mask layers 16a and 16b, typically and preferably by an extension distance at each side of the patterned silicon oxide hard mask layer 20 of from about 0.15 to about 0.5 microns. Similarly, incident to such partial consumption of the partially ion implanted blanket polysilicon layer 14' there is formed therefrom a thermally annealed partially consumed partially ion implanted blanket polysilicon layer 14".

Within the preferred embodiment of the present invention, the oxidizing thermal annealing atmosphere 19 typically and preferably employs a temperature of from about 900 to about 1100 degrees centigrade, typically and preferably within either or both of an oxygen ambient and a steam ambient. As is similarly also illustrated within the schematic cross-sectional diagram of FIG. 3, upon forming the patterned silicon oxide hard mask layer 20 and the thermally annealed partially consumed partially ion implanted blanket polysilicon layer 14", there is typically and preferably minimal if any thermal diffusion of the preferably lower thermal diffusivity dopant ions implanted into the heavily doped ion implanted region of the thermally annealed partially consumed partially ion implanted blanket polysilicon layer 14".

Figure 4:
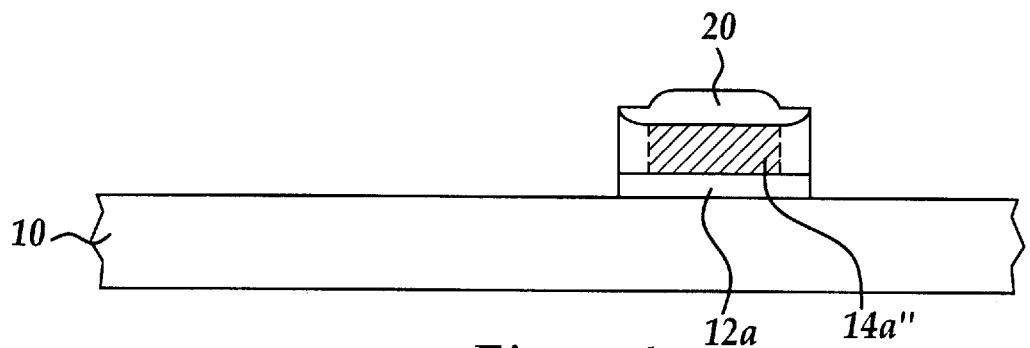

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the pair of patterned silicon nitride hard mask layers 16a and 16b has been stripped from the thermally annealed partially consumed partially ion implanted blanket polysilicon layer 14". The pair of patterned silicon nitride hard mask layers 16a and 16b may be stripped from the thermally annealed partially consumed partially ion implanted blanket polysilicon layer 14" as illustrated within the semiconductor integrated circuit microelectronic fabrication whose schematic cross-sectional diagram of FIG. 3 to provide in part the semiconductor integrated circuit microelectronic fabrication whose schematic cross-sectional diagram is illustrated in FIG. 4 while employing silicon nitride stripping methods and materials as are otherwise generally conventional in the art of semiconductor integrated circuit microelectronic fabrication, such stripping methods and materials typically and preferably including wet chemical silicon nitride stripping methods and materials and dry plasma silicon nitride stripping methods and materials, but more preferably aqueous phosphoric acid wet chemical stripping methods and materials.

As is similarly also in part illustrated within the schematic cross-sectional diagram of FIG. 4, there is then employed the patterned silicon oxide hard mask layer 20 as a hard mask layer for forming sequentially from: (1) the thermally annealed partially consumed partially ion implanted blanket polysilicon layer 14" as illustrated within the schematic diagram of FIG. 3 a thermally annealed partially consumed partially ion implanted patterned polysilicon layer 14a"; and (2) the blanket gate dielectric layer 12 as illustrated within the schematic cross-sectional diagram of FIG. 3 a patterned gate dielectric layer 12a. Although the patterned silicon oxide hard mask layer 20 may be employed for forming each of the foregoing two patterned layers while employing a corresponding etch method selected from the group consisting of wet chemical etch methods and dry plasma etch methods, sequential dry plasma etch methods are generally preferred due to their anisotropic character.

As is understood by a person skilled in the art, and as is illustrated within the schematic cross-sectional diagram of FIG. 4, insofar as the patterned silicon oxide hard mask layer 20 was formed extending beneath the pair of patterned silicon nitride hard mask layers 16a and 16b as illustrated within the schematic cross-sectional diagram of FIG. 3, the thermally annealed partially consumed partially ion implanted patterned polysilicon layer 14a" as illustrated within the schematic cross-sectional diagram of FIG. 4 is formed with a central annular portion (with shading) having a comparatively high dopant concentration (typically and preferably from about 1E14 to about 1E15 dopant atoms per square centimeter) and a peripheral annular portion (without shading) having a comparatively low dopant concentration.

Figure 5:
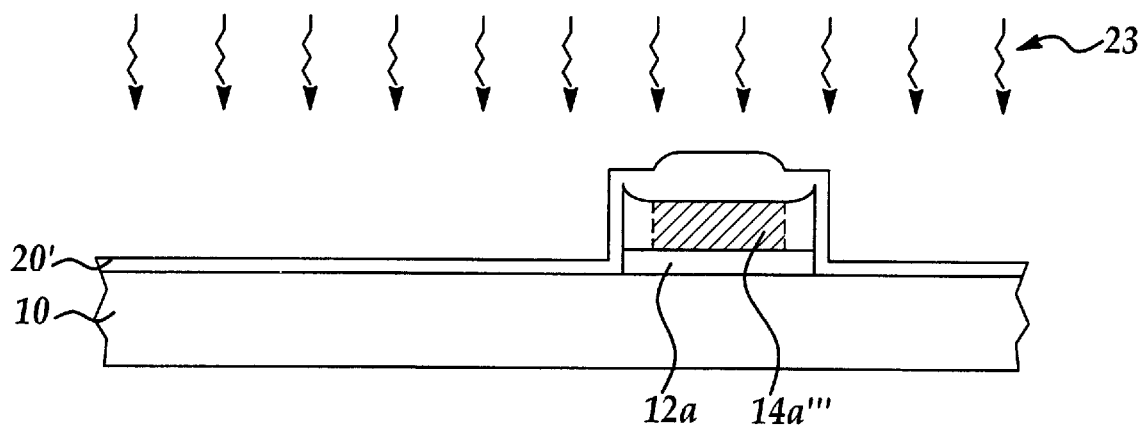

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed upon exposed portions of the semiconductor substrate 10, the patterned gate dielectric layer 12a and the thermally annealed partially consumed partially ion implanted patterned polysilicon layer 14a" as illustrated within the schematic cross-sectional diagram of FIG. 4, while incorporating therein the patterned silicon oxide hard mask layer 20, and while employing a second oxidizing thermal annealing method employing a second oxidizing thermal annealing atmosphere 23, a contiguous blanket gate dielectric layer and inter-gate electrode dielectric layer 20'.

Within the preferred embodiment of the present invention the contiguous blanket gate dielectric layer and inter-gate electrode dielectric layer 20' is formed in a first instance by employing the second oxidizing thermal annealing method which employs the second oxidizing thermal annealing atmosphere 23 such as to consume surface portions of the semiconductor substrate 10 and the thermally annealed partially consumed partially ion implanted patterned polysilicon layer 14a" to form therefrom a corresponding partially consumed semiconductor substrate 10' and a corresponding polysilicon floating gate electrode 14a'''. Within the preferred embodiment of the present invention the second oxidizing thermal annealing atmosphere 23 as illustrated within the schematic cross-sectional diagram of FIG. 5 is generally analogous with the first oxidizing thermal annealing atmosphere 19 as illustrated within the schematic cross-sectional diagram of FIG. 3. Similarly, insofar as the thermally annealed partially consumed partially ion implanted patterned polysilicon layer 14a" is formed with a comparatively lightly doped peripheral annular region, the portion of the contiguous blanket gate dielectric layer and blanket inter-gate electrode dielectric layer 20' is formed with a more limited, controlled and uniform thickness thereupon incident to its thermal oxidation when forming the doped polysilicon floating gate electrode 14a'''. Such uniform thickness ultimately yields enhanced erasing speed properties within a split gate field effect transistor (FET) device which results from further processing of the semiconductor integrated circuit microelectronic fabrication whose schematic cross-sectional diagram is illustrated in FIG. 5.

As is understood by a person skilled in the art, and although not specifically illustrated within the schematic cross-sectional diagram of FIG. 5, the contiguous blanket gate dielectric layer and inter-gate electrode dielectric layer 20' may also comprise a blanket deposited dielectric layer formed from a dielectric material selected from the group including but not limited to silicon oxide dielectric materials, silicon nitride dielectric materials and silicon oxynitride dielectric materials. Typically and preferably, and in particular at locations adjoining the partially consumed semiconductor substrate 10' and the doped polysilicon floating gate electrode 14a''', the contiguous blanket gate dielectric layer and blanket inter-gate electrode dielectric layer 20' is formed to a limited, controlled and uniform thickness of from about 120 to about 250 angstroms.

Figure 6:
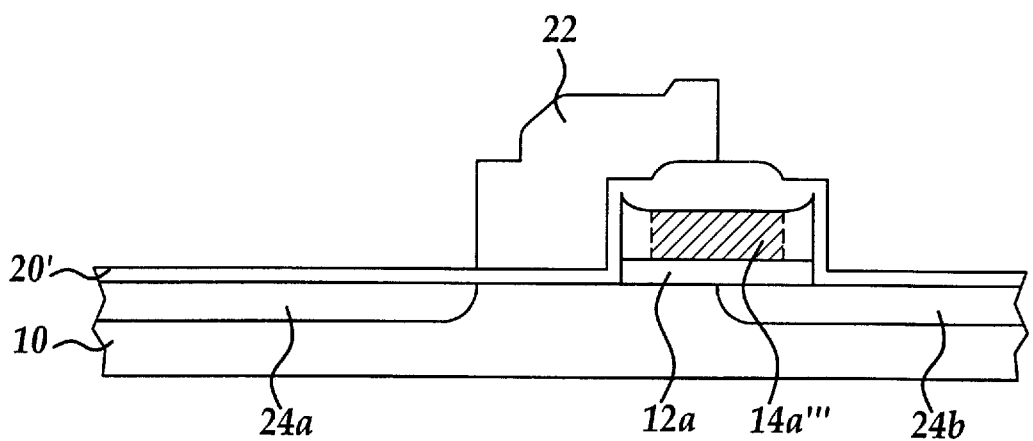

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is formed covering a portion of the contiguous blanket gate dielectric layer and inter-gate electrode dielectric layer over the partially consumed semiconductor substrate 10' and also covering a portion of the doped polysilicon floating gate electrode 14a''' a control gate electrode 22.

Within the preferred embodiment of the present invention, the control gate electrode 22 may in general be formed from any of several conductor materials which are typically and preferably employed for forming control gate electrodes within semiconductor integrated circuit microelectronic fabrications. More particularly, the control gate electrode 22 is typically and preferably formed from a polysilicon conductor mateiral which in contrast with the polysilicon conductor mateiral from which is formed the doped polysilicon floating gate electrode 14a''' has a uniform dopant concentration.

Finally, there is also shown within the schematic cross-sectional diagram of FIG. 6 formed into the semiconductor substrate 10' a pair of source/drain regions 24a and 24b, where a first source/drain region 24a (typically and preferably a drain region) is formed nominally aligned with an edge of the control gate electrode 22 and a second source/drain electrode 24b (typically and preferably a source region) extends beneath the doped polysilicon floating gate electrode 14a'''.

As is understood by a person skilled in the art, the first source/drain region 24a and the second source/drain region 24b are typically and preferably formed separately when forming the split gate field effect transistor (FET) whose schematic cross-sectional diagram is illustrated in FIG. 6, with the second source/drain region 24b typically and preferably being formed employing a dopant of enhanced thermal diffusivity with respect to the first source/drain region 24a (i.e., phosphorus in comparison with arsenic) such as to provide for enhanced thermal diffusion of the second source/drain region 24b underneath the doped polysilicon floating gate electrode 14a'''.

Similarly, and as is also understood by a person skilled in the art, by forming within the context of the present invention the doped polysilicon floating gate electrode 14a''' with a comparatively highly doped central annular region, and while similarly having formed extending thermally diffused therebeneath the second source/drain region 24b which serves as a source region within the split gate field effect transistor (FET) whose schematic cross-sectional diagram is illustrated in FIG. 6, there is provided enhanced coupling between the doped polysilicon floating gate electrode 14a'' and the second source/drain region 24b, thus consequently providing enhanced programming speed properties within the split gate field effect transistor(FET) device whose schematic cross-sectional diagram is illustrated in FIG. 6.

As is further understood by a person skilled in the art, the preferred embodiment of the present invention is illustrative of the present invention rather than limiting of the present invention. Revisions and modifications may be made to methods, materials, structures and dimensions which are employed for forming a split gate field effect transistor (FET) in accord with the preferred embodiment of the present invention, while still providing a split gate field effect field effect transistor (FET) device, and a method for fabrication thereof, in accord with the present invention, further in accord with the accompanying claims.

What is claimed is:

1. A method for fabricating a split gate field effect transistor comprising:

providing a semiconductor substrate;

forming upon the semiconductor substrate a gate dielectric layer;

forming upon the gate dielectric layer a doped polysilicon floating gate electrode, the doped polysilicon floating gate electrode having a higher dopant concentration in a central annular portion of the doped polysilicon floating gate electrode than in a peripheral annular portion of the doped polysilicon floating gate electrode;

forming over the doped polysilicon floating gate electrode an inter-gate electrode dielectric layer;

forming over the inter-gate dielectric layer and covering at least a portion of the doped polysilicon floating gate electrode a control gate electrode; and forming into the semiconductor substrate a pair of source/drain regions which define within the semiconductor substrate a floating gate electrode channel with respect to the polysilicon floating gate electrode and an adjoining control gate electrode channel with respect to the control gate electrode.

2. The method of claim 1 wherein the gate dielectric layer is formed to a thickness of from about 70 to about 120 angstroms.

3. The method of claim 1 wherein the doped polysilicon floating gate electrode is formed to a thickness of from about 500 to about 1500 angstroms.

4. The method of claim 1 wherein the inter-gate electrode dielectric layer is formed to a thickness of from about 120 to about 250 angstroms.

5. The method of claim 1 wherein the control gate electrode is formed to a thickness of from about 1500 to about 2500 angstroms.

6. The method of claim 1 wherein the central annular portion of the doped polysilicon floating gate electrode has a linewidth of from about 0.15 to about 0.5 microns and the peripheral annular portion of the doped polysilicon floating gate electrode has a linewidth of from about 0.03 to about 0.08 microns.

7. The method of claim 1 wherein the central annular portion of the doped polysilicon floating gate electrode and the peripheral annular portion of the doped polysilicon floating gate electrode are formed employing a single ion implanted dopant.

8. The method of claim 1 wherein the central annular portion of the doped polysilicon floating gate electrode and the peripheral annular portion of the doped polysilicon floating gate electrode are formed employing a pair of ion implanted dopants of differing thermal diffusivity.

* * * * *